United States Patent [19]

Bailey

[11] 3,943,293

[45] Mar. 9, 1976

[54] STEREO SOUND REPRODUCING APPARATUS WITH NOISE REDUCTION

[75] Inventor: Arthur Raymond Bailey, Bingley, England

[73] Assignee: Ferrograph Company Limited, England

[22] Filed: Nov. 5, 1973

[21] Appl. No.: 412,896

[30] Foreign Application Priority Data

Nov. 8, 1972 United Kingdom............... 51395/72

[52] U.S. Cl............. 179/15 BT; 179/1 G; 179/1 GQ
[51] Int. Cl.².......................................... H04H 5/00
[58] Field of Search............ 360/65; 179/1 GQ, 1 G, 179/15 BT, 100.4 ST, 100.1 TD, 1 P

[56] References Cited
UNITED STATES PATENTS

| | | | |
|---|---|---|---|
| 3,094,587 | 6/1963 | Dow ........................... | 179/100.4 ST |
| 3,417,203 | 12/1968 | Hafler ................................ | 179/1 G |
| 3,539,729 | 11/1970 | Von Recklinghausen ...... | 179/15 BT |
| 3,673,342 | 6/1972 | Muller ........................... | 179/15 BT |
| 3,783,192 | 1/1974 | Takahashi .................. | 179/100.4 ST |
| 3,786,193 | 1/1974 | Tsurushima ..................... | 179/1 GQ |
| 3,823,268 | 7/1974 | Modafferi ....................... | 179/15 BT |

FOREIGN PATENTS OR APPLICATIONS 1,544,200   9/1967   France ...................... 179/100.4 ST Primary Examiner—William C. Cooper
Assistant Examiner—George G. Stellar
Attorney, Agent, or Firm—Edward F. Connors

[57] ABSTRACT

To reduce the effects of noise in stereo audio apparatus, cross talk is introduced between the output channels in a frequency sensitive manner, the amount of cross talk being controlled in accordance with an input or output signal level on the level of two or more combined signals.

16 Claims, 12 Drawing Figures

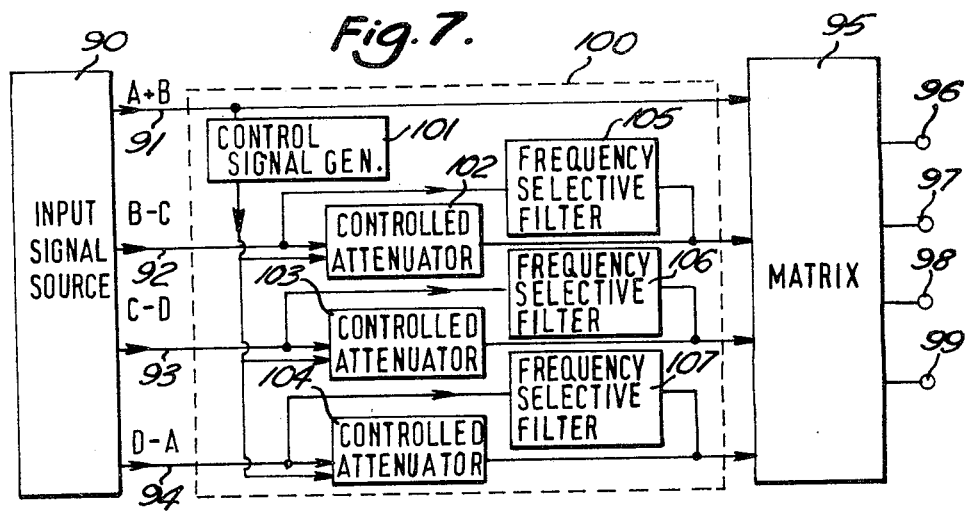
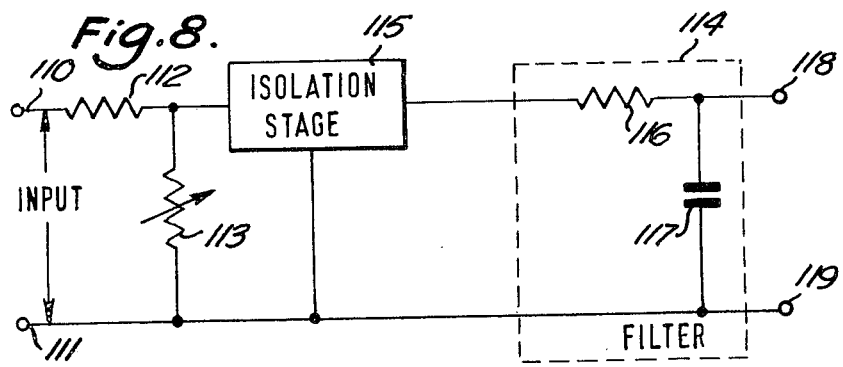
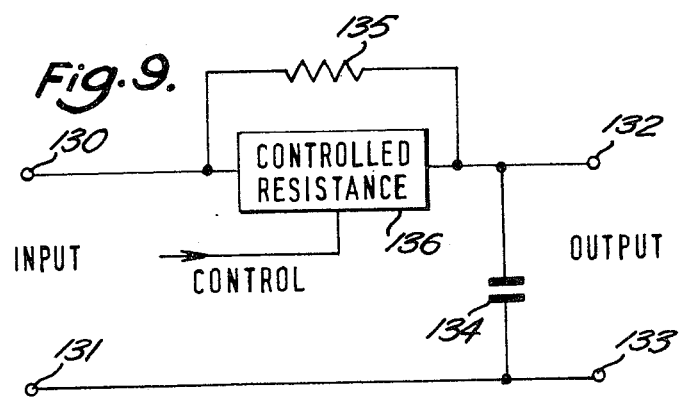

STEREO SOUND REPRODUCING APPARATUS WITH NOISE REDUCTION

BACKGROUND OF THE INVENTION

1. Field of the Invention

This invention relates to stereo audio apparatus having two or more audio output channels.

2. Prior Art

Multi-channel sound reproducing apparatus may, for the present purposes, be considered as being divided into two distinct types namely (1) systems where the noise has a similar value on both channels and (2) systems where the noise on one channel is considerably different from that on the other channel. The present invention is applicable to both these types but, as will be apparent from the following description has particular advantages with the second type where, for reasons discussed below, the problem of noise is much more serious.

In stereo sound radio transmissions, the present practice is to transmit, as a frequency modulation on the radio frequency carrier, a composite signal which, when demodulated has signals in the band from 0 to 15 kHz which are referred to hereinafter as the A+B signals and which correspond to the sum of the sound signals from the left and right audio transducers and also has, centred on a 38 kHz sub-carrier, signals within the band from about 23 kHz to 53 kHz which are referred to hereinafter as the A−B signals and which correspond to the difference of the required outputs from the left and right-hand audio transducers. These two sets of signals are separated in the receiver and then fed to a decoding matrix which combines the signals so as to provide separate A and B outputs, that is to say separate outputs which may be fed to the left and right-hand audio transducers. The above-described system for transmitting stereo programmes on radio provides a compatible system in that such programmes can be received on a "mono" receiver, that is to say a receiver responsive to demodulated signals in the audio band and having a single sound transducer. The output from the sound transducer is the A+B signal.

However, as is well known, the reception of stereo programmes on radio is often very poor, particularly for weak signals, and is much degraded compared with reception in the mono form. This degraded performance is inherent in the use of frequency modulation and the method of stereo coding which gives a noise factor on stereo which is much worse than on mono reception. The noise factor is typically 10 times worse on stereo. Thus for weak stereo signals or poor tuners giving only just adequate mono performance, this means that the programme can be tolerated in the mono mode but not in the stereo mode because of the increased noise generated by the stereo decoder. In addition, the stereo noise produced is weighted towards the high frequency part of the audio spectrum. The human ear is subjectively far more sensitive to random noise at the high frequency part of the audio spectrum compared with the lower frequency end where the ear is relatively tolerant to quite large amounts of noise.

The present invention is directed to reducing the noise level in the audio frequency output of a stereo audio apparatus. It is applicable both to systems where the noise level is similar on various channels and to systems where there are different noise levels on the various channels.

Heretofore, the problem of noise in stereo broadcast systems has been tackled by trying to reduce the band width by using amplitude compression before transmitting the signals and providing complementary expansion in the receiver. To introduce such techniques however requires modification of both transmitting and receiving equipment and cannot therefore readily be introduced into existing equipment.

BRIEF SUMMARY OF THE INVENTION

According to this invention, in stereo audio apparatus having input means providing two or more audio frequency input signals and two or more audio frequency signal output terminals to which are fed audio output signals derived from the input signals, there are provided controllable means for introducing cross talk between output signals to the output terminals, and control means responsive to the amplitude of at least one of the input and/or output signals operative on said controllable means to increase the cross talk as the signal level decreases. The means responsive to the signal level preferably is made responsive to the level of an input signal.

If there are two channels with noise having similar values on both channels, the noise signals will be random on the two channels. Combining the two signals, that is to say by introducing cross talk over the whole audio frequency band so that both input signals are fed at equal levels to each of the sound reproducers, would produce a 3 dB improvement in the overall signal-to-noise performance. This will be at the expense of reducing the stereo effect. Subjectively however it will generally be preferably to reduce the stereo effect at low signal levels, particularly as the cross talk is preferably introduced, as described later, in a frequency selective manner, to give noise reduction at higher frequencies.

The system however finds more particular application in apparatus where the noise level on one channel is considerably different from that on one or more other channels. This occurs in a frequency modulated stereo radio receiver as described above. In such an arrangement there is a large anti-phase noise component between the two channels and the introduction of cross talk can reduce the overall noise up to a theoretical limit of approximately 22 dB over the complete audio frequency spectrum. The full stereo effect is maintained so long as the signal level of the signal or signals providing the control is sufficient. The relationship between the decrease in signal level and increase in cross talk may be chosen in accordance with any predetermined requirements. The operation of the system is fully automatic and ensures that in conditions of low signal level of the incoming audio signals, cross talk is introduced so as to reduce the noise level in the audio output.

In a stereo radio receiver, the demodulated audio frequency signals are fed to a matrix which, in the simplest case, consists of a sum and a difference unit, to convert the A+B and A−B signals to A and B signals. The cross talk is conveniently introduced in the matrix by modifying one of the input signals, preferably the A−B signal.

As mentioned above, the human ear is subjectively far more sensitive to random noise in the higher frequency part of the audio spectrum than in the lower frequency part and, for this reason therefore it is preferred to introduce the cross talk in a frequency sensitive manner with higher cross talk at higher frequencies. As the signal level falls, the frequency at which the cross talk is effectively introduced can be gradually decreased.

To provide frequency selective controlled cross talk, some or each of the channels for the incoming signals may be provided with a frequency selective filter the output of which is fed through a controllable attenuator and thence added into the signal of the other channel or channels. The controllable attenuator conveniently is a controllable resistance. This resistance may be incorporated in the filter circuit as part of the filter. In a simple arrangement, the filter may comprise a shunt capacitor with a series resistor and the controllable attenuator may comprise a controllable resistor, for example a transistor or photosensitive device connected in shunt across the filter, preferably across the input of the filter. An isolation stage may be provided between the attenuator and the filter. In another simple arrangement, the filter as before comprises a shunt capacitor and series resistor and the controllable resistor is provided in parallel with the aforementioned series resistor thereby providing a cut-off filter with an adjustable cut-off level.

It is possible to provide cross talk between the channels and to make the control reduce the cross talk for example, in a two-channel system, by feeding from controllable attenuators subtractively into each of the output signals from the other channel. Preferably however the control is effected in the simplest way by adding a controllable amount of the signal from one channel into the output from another channel or, in a system having a matrix for processing input signals, by attenuating one or more of the input signals to the matrix.

In a system in which signals for two reproducers are additively combined in one of the input channels, as is the practice in conventional FM stereo radio receivers, preferably the signal level in that incoming channel is used as the controlling signal for controlling the cross talk. In quadrophonic systems, similarly it is the practice to have one channel with the sum signals of two front sound reproducers and the signal level in this channel is preferably used as the control signal. The invention may equally well be applied to quasiquadrophonic systems in which only two incoming signals are used for feeding four sound reproducers. More generally however the control signal may be derived from any one or a combination of the incoming signals. If the control is provided by a d.c. voltage then the input signals providing this voltage may be combined before rectification or after rectification. If there is one signal which is considerably less noisy than the others then it may be preferred to use this signal to control the cross talk. However more generally one may use any input or output signal or a combination of signals.

The amount of cross talk need not be the same in each channel. Separate control means may be provided for controlling the cross talk added to the signal at each output terminal and, for example, in one arrangement, the cross talk added to the signal at each output terminal is controlled in accordance with the signal level at that terminal; thus if any output has a low signal level, cross talk is introduced, preferably in a frequency relative manner as previously described, to improve the signal to noise ratio in that channel.

BRIEF DESCRIPTION OF THE DRAWINGS

FIGS. 1 to 7 are each a block diagram illustrating an apparatus providing two or more audio frequency outputs;

FIGS. 8 and 9 are circuit diagrams illustrating two controllable attenuator/filter networks;

DESCRIPTION OF THE PREFERRED EMBODIMENTS

Figure 1:
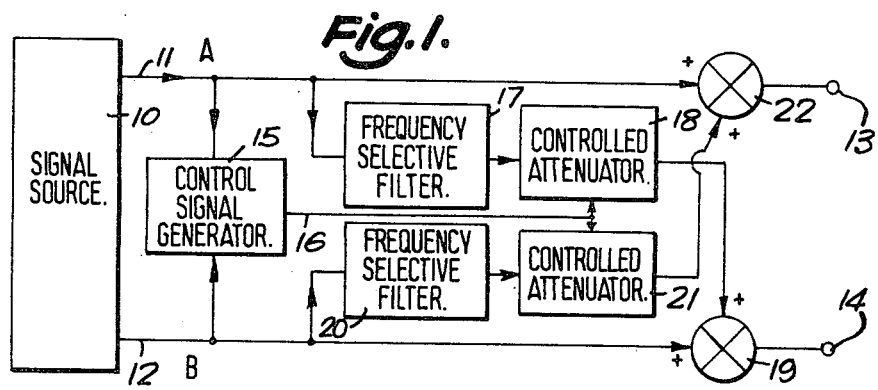

Referring to FIG. 1 there is shown diagrammatically an input signal source 10 providing two audio frequency output signals on two channels 11, 12 for feeding respectively (possibly with further amplification) to two output terminals 13, 14. The outputs at these terminals would typically be applied via amplifiers to loud speakers. The arrangement of FIG. 1 is a system in which the noise level is essentially similar on the two channels 11, 12. The unit 10 may be for example a two-channel tape reproducer or gramophone record player. The signals on the two channels 11, 12 are combined in a control signal generator 15 to provide a control signal on an output lead 16. The signal from channel 11, that is the A signal, is applied to a frequency selective filter 17, comprising a high pass filter with the cut-off within the audio frequency band. The output from the filter 17 is fed, via a controllable attenuator 18, or other variable transfer ratio device, into a summing unit 19 where it is combined directly with the B signal on lead 12 for feeding to the output terminal 14. The signal on lead 12, that is the B signal, is applied through a further frequency selective filter 20, similar to the filter 17, and a controllable attenuator 21 or other variable transfer ratio device to a summing unit 22 where the output of the attenuator 21 is summed with the A channel signal on lead 11 before being fed to the A channel output terminal 13. The two attenuators 18, 21 are controlled by the aforementioned control signal on lead 16 in such a way that at high input signal levels, zero control signal is fed to the summing units 19, 22 whereas, at low input signal levels, an appreciable signal is fed to the summing units. The maximum control signal is arranged to make the two inputs to each summing unit the same, at least at higher frequencies. With this maximum output, each terminal 13, 14 is fed with A+B signals at least at the higher frequencies.

With random noise in the two channels, the maximum improvement in noise performance can only be 3 dB. This may be worthwhile however in some applications particularly bearing in mind the subjective effect of reducing the noise in the higher frequency part of the audio spectrum.

Figure 2:
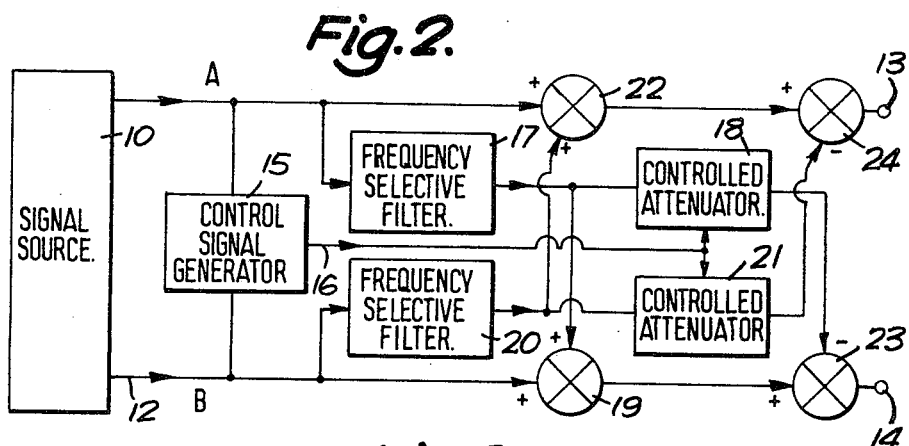

FIG. 2 illustrates a modification of the arrangement of FIG. 1 which has a similar performance. In the following description of FIG. 2, the same reference characters are used as in FIG. 1 and reference will be made only to the distinctive features of FIG. 2. In FIG. 2, the outputs of the frequency selective filters 17, 20 are fed directly to the summing units 19, 22 instead of via the controllable attenuators 18, 21. The outputs from the frequency selective filters 17, 20 are also applied however to the two controllable attenuators 18, 21 and the controlled outputs are then fed into subtraction units 23, 24 which subtract the attenuated A signal from the output from summing unit 19 to provide the feed to output terminal 14 and subtract the attenuator B signal from the output from summing unit 22 to provide the feed to the terminal 13. In this case the maximum cross talk has been introduced by the summing units 19, 22 and its effect is removed by adding complementary signals to cancel out part of the added cross talk. The controllable attenuators 18, 21 therefore will have to give increased outputs as the incoming signal level increases.

Figure 3:
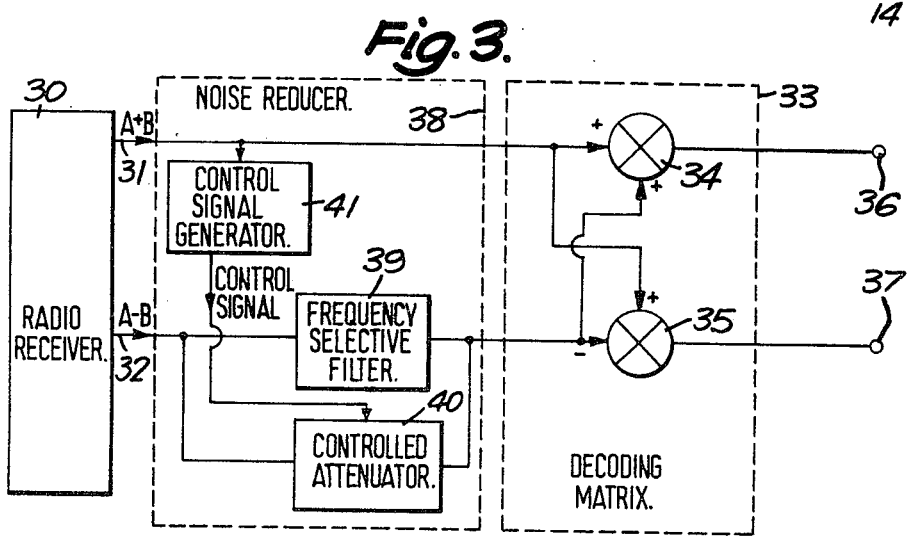

FIG. 3 illustrates diagrammatically a sound reproducing system in which the noise on one channel is very different from that on the other channel. This occurs for example in an FM stereo radio receiver where the outputs after demodulation are the A+B and A−B signals as described previously. Referring to FIG. 3 there is shown diagrammatically an input signal source 30, typically an FM radio receiver providing outputs on two channels 31, 32 carrying the aforementioned A+B and A−B signals respectively. These are applied to a decoding matrix 33 which comprises a summing unit 34 and a difference unit 35. This decoding matrix unit may be similar to conventional decoding matrix such as is commonly employed in FM stereo radio receivers. If the A+B and A−B signals are fed directly to the summing unit 34, the output thereof will be 2A and this is applied to one of the output terminals 36. If the A+B and A−B units are fed directly to the difference unit 35, the output thereof would be 2B and this is fed directly to the second output terminal 37. In the arrangement of FIG. 3, a noise reducer unit 38 is incorporated in the circuit. This includes a frequency selective filter 39 in the A−B channel 32. This filter, in this particular embodiment, has a cut-off frequency within the audio frequency band so as to reduce the higher frequency components of the difference A−B. Bypassing the filter 39 is a controllable attenuator 40 which is controlled by means of a d.c. control signal from a control signal generator 41. This control signal generator essentially comprises a rectifier to which is applied the A+B signal from channel 31. When the input on channel 31 is high, the control signal from the generator 41 reduces the impedance of the controllable attenuator 40 to such a level that it effectively bypasses the frequency selective filter 39. The filter then has no effect and the apparatus works as a conventional two-channel stereo system. However as the signal level in channel 31 falls, the effect of the bypass is gradually reduced and thus a frequency selective filter effect is gradually introduced into the difference channel 32 thereby reducing the higher frequency components in that channel. The effect of this reduction of the higher frequencies is to introduce cross talk into the system (as in the arrangement of FIG. 1) so that the output from summing unit 34 is no longer 2A but, in the extreme if the highest frequency components were reduced to zero in the channel 31, would be A+B at those frequencies. Similarly the output to the second output terminal 37 at the higher frequencies would, in the extreme where the filter 39 reduces the signal at those frequencies to zero, also be A+B. The A+B signals on channel 31 are inherently the lower noise signals and thus, for the higher frequencies, the noise level at the terminals 36, 37, has been reduced at the expense of reducing the stereo effect. The operation is automatic and the relationship between the reduction in noise and incoming signal level may be chosen as desired. The choice will necessarily be subjective in the sense that it is a matter of choosing a compromise between noise and stereo effect. With the system of the present invention however the operation is fully automatic and the noise level is only decreased when the signal is low and hence when the noise conditions are more troublesome to the listener.

It will be particularly noted that the arrangement of FIG. 3, as applied to a radio receiver, is essentially a conventional stereo radio receiver with the addition solely of the noise reducer unit 38 comprising the frequency selective filter 39, the control signal generator 41 and the controllable attenuator 40.

Figure 4:
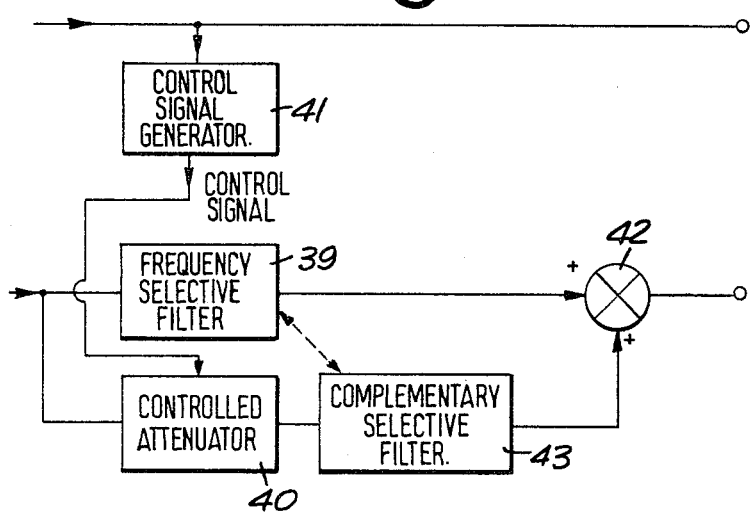

FIG. 4 illustrates a modification of the noise reducer unit 38 of FIG. 3 and the same reference characters are used to indicate corresponding components. In the arrangement of FIG. 4 there is provided additionally however a summing unit 42 to one input of which is fed the output from the frequency selective filter 39 and to the other input of which there is fed the signal from the controllable attenuator 40 via a further selective filter 43 which has a characteristic complementary to that of the filter 39. The output from the control signal generator 41 is used as a d.c. control signal to control the attenuator 40 but, in the arrangement of FIG. 4, the frequency selective filter 39 is operative at all signal levels to reduce the amplitude of the higher frequency component and the action of the controllable attenuator 40 and complementary filter 43 is to restore these higher frequency components when the signal input level is high. When the signal input level falls, the output from the attenuator 40 is decreased and hence, at higher frequencies, the signal fed into the matrix from the summing unit 42 on the A−B channel is reduced. The arrangement of FIG. 4 thus produces similar results to that of FIG. 3, introducing cross talk at higher frequencies when the signal amplitude is low.

Figure 5:
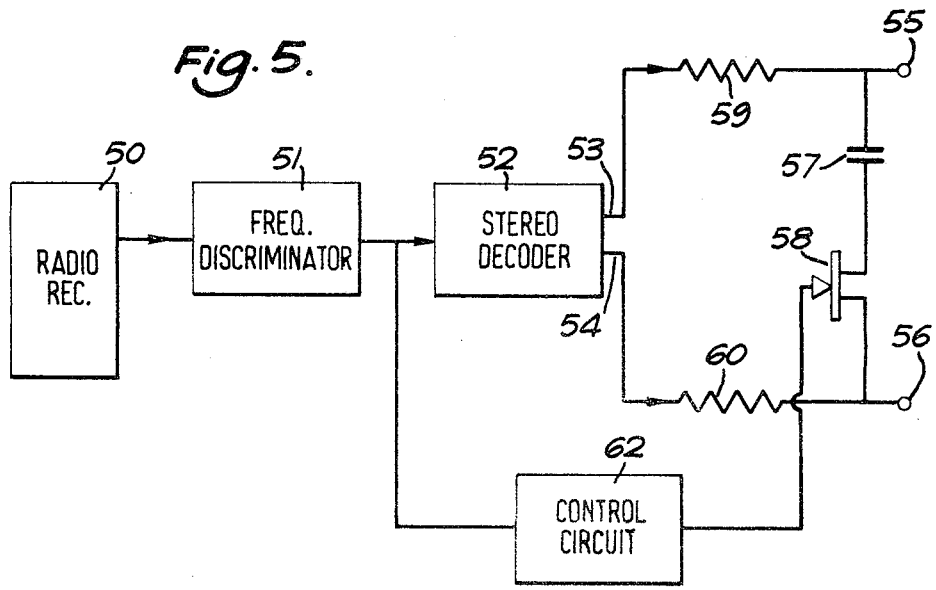

FIG. 5 illustrates in diagrammatic form yet another construction of stereo sound reproducing apparatus. In FIG. 5 there is shown an input unit 50, typically part of a frequency modulation stereo radio receiver providing intermediate frequency signals which are fed to a discriminator 51 to give an output to a stereo decoder 52. From the decoder 52 are signals on two channels 53, 54. These signals are fed to output terminals 55, 56 for connection via amplifiers to loudspeakers. Adjustable cross talk at higher frequencies is provided by means of a shunt circuit comprising a capacitor 57 and field effect transistor 58. The channels 53, 54 include series resistors 59, 60 respectively, these resistors and the capacitance in the shunt circuit determining the frequency at which cross mixing takes place. A control circuit 62 responsive to the signal lead in the output of the discriminator 51 controls the bias on the transistor. The control circuit essentially provides a direct voltage dependent on the signal level of the input to the stereo decoder 52. The control might be effected from the A or the B signal or the A+B signal or even the A−B signal (if the A−B signal becomes zero then it does not matter whether there is cross talk). This control circuit may include a high pass filter and rectifier so that the control is dependent on the high frequency component. In some circumstances, it may be preferred to use a photo-transistor as the transistor 58 in the shunt circuit and in this case the control circuit controls the illumination of the photo-transistor; in such a case the control signal may be fed directly to a lamp and rectification is not necessary. The control circuit 62 is arranged so that the full stereo output is obtained at the two terminals 55, 56 when the input signal level is high enough but that, when this signal level falls, cross talk is introduced, as in the previously-described embodiments, so as to improve the signal-to-noise ratio of the signals fed to the two terminals 55, 56.

Figure 6:
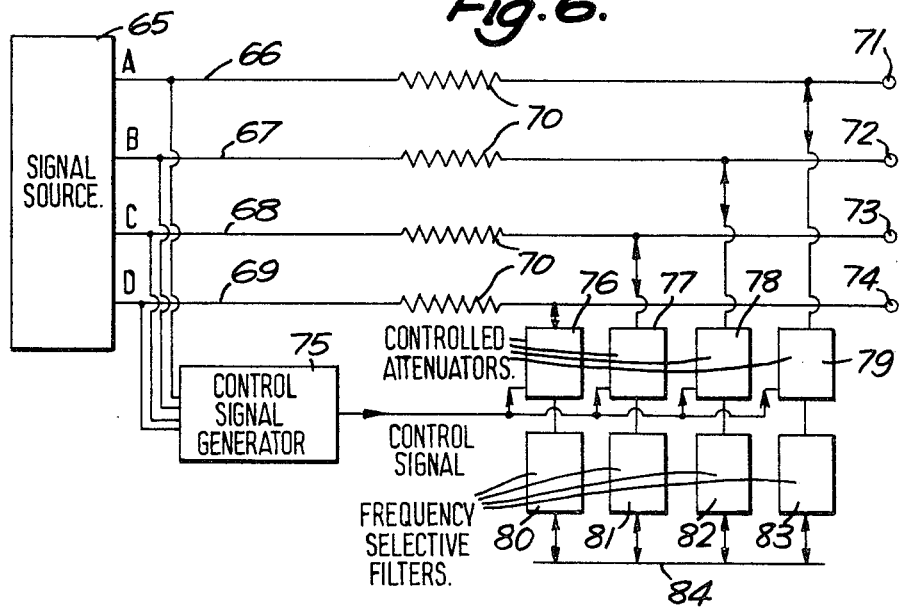

FIG. 6 illustrates one way in which the invention may be applied to a four-channel system. The arrangement of FIG. 6 is for a system in which the channels have similar noise levels and it provides for cross talk to be introduced between all the channels when the input signals are at a low level. In FIG. 6, input means 65 provides signals on four channels 66, 67, 68 and 69 leading via resistors 70 respectively to four output terminals 71, 72, 73, 74. A control signal generator 75 is responsive to the sum of the signals on the four channels 66–69 to generate a d.c. control signal which is applied to four controllable attenuators 76 to 79 which are connected respectively between outputs of the four channels and four frequency selective filters 80 to 83 which have a common terminal 84. If the controllable attenuators 76–79 all have a low impedance, then the frequency selective filters provide frequency selective cross talk between the four channels. As the input signal level rises, the filters 80–83 are progressively removed from the circuit by the increased impedance of the controllable attenuators 76–79. A single control signal may be applied to all these attenuators as shown in FIG. 6 but this need not be so and the control levels can be arranged as befits the particular system. For example, in a "quadrophonic" reproducing system, the combined amplitudes of the signals for the front pair of channels may be used to control the cross talk between those channels, the combined amplitudes of the signals for the rear pair of channels may be used to control the cross talk between these channels, and the amplitudes of the two front-to-back pairs may be used to control their respective cross talk levels.

FIG. 7 illustrates a quadrophonic reproducing system with control signals controlling the cross talk between pairs of channels. In FIG. 6 input means 90 provides four signal outputs on leads 91, 92, 93, 94 with a signal on lead 90 corresponding to A+B signals, that is to say the sum of the signals for the front pair of transducers. The signals for the rear transducers are the C and D signals and leads 91, 92 and 93 carry different signals B–C, C–D and D–A respectively. Such an arrangement is known in quadrophonic reproducing systems and the four signals are fed to a matrix 95 to provide the outputs to four terminals 96–99 for connection via amplifiers to four loudspeakers. FIG. 7 illustrates a noise reduction unit 100 which is connected between the signal source 90 and the matrix 95 to provide reduction of noise at low signal levels. In a quadrophonic system there is usually one signal which will be expected to have a noise level significantly lower than the remainder. In a quandrophonic system such as is illustrated in FIG. 7, the difference signals would be transmitted as modulations on pilot tones whereas the A+B sum signal would be directly modulated onto the radio frequency carrier. It is the signals around the pilot tones that tend to have large noise components owing to their noise characteristics inherent in the FM system. These signals would therefore normally be the rear signals and the front difference signal. The monophonic or front sum signal on lead 91 is therefore used for control purposes and is applied to a control signal generator 101. The control signal from the control signal generator is fed to three controllable attenuators 102, 103 and 104 which control the bypassing of frequency selective filters 105, 106 and 107. Each attenuator and frequency selective filter operates in a manner generally similar to the attenuator 40 and filter 39 of FIG. 3. The three higher noise channels, that is to say the difference channels, thus can have their higher frequency components attenuated at low signal input levels. This attenuation increases the cross talk in the matrix as in FIG. 3 except that, in FIG. 7, three channels are controlled.

In the above-described arrangements, the signal controlling the attenuation of the controlled attenuators or transfer ratio devices may be derived from the input signal in a number of different ways. If the incoming signals have similar noise contents then one may use any one or a combination of the incoming signals. If a direct voltage is required for control purposes and if a number of signals are to be combined to provide the control signal then the combination may be effected before or after rectification. If an electro-optical system is employed, then the signals may be directly applied to a lamp without rectification.

In apparatus in which one signal is considerably less noisy than the others, such as the sum signal in an FM stereo system, then the preferred method will often be to use this signal as the control signal.

Figure 10:
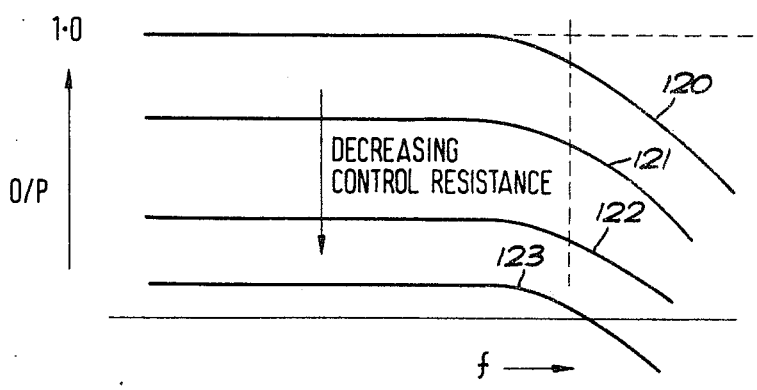
FIGS. 10 and 11 are graphical diagrams illustrating the characteristics of the networks of FIGS. 8 and 9.

It has been convenient in FIGS. 1 to 7 to show the filter and controlled attenuators as separate components but they need not be separate. FIG. 8 illustrates one arrangement of attenuator and filter as separate components. The input signal across leads 110, 111 is applied via a series resistor 112 and a shunt control resistor 113 to the filter 114 via an isolation stage 115. The attenuator controls the signal level by variation of the control resistance 113, which might be a transistor such as a field effect transistor or a photo field effect transistor or a bipolar transistor or photoconductive cell. The filter 114 comprises a series resistor 116 and shunt capacitor 117. The output from the filter is fed to output terminals 118, 119. The characteristics of such an arrangement are illustrated in FIG. 10 in which there is shown a curve 120 representing the relationship between output signal level (as ordinate) and frequency (as abscissa) when the controlled resistance 113 is at its maximum value. As the resistance 113 is decreased, the output/frequency characteristic changes as indicated by the curves 121 to 123 which represent the characteristics for various successively lower resistance values. It will be seen that, with this arrangement, the cut-off frequency of the filter is not changed but the overall level of the amplitude at the output terminals varies according to the magnitude of the controlled resistance 113.

Figure 11:
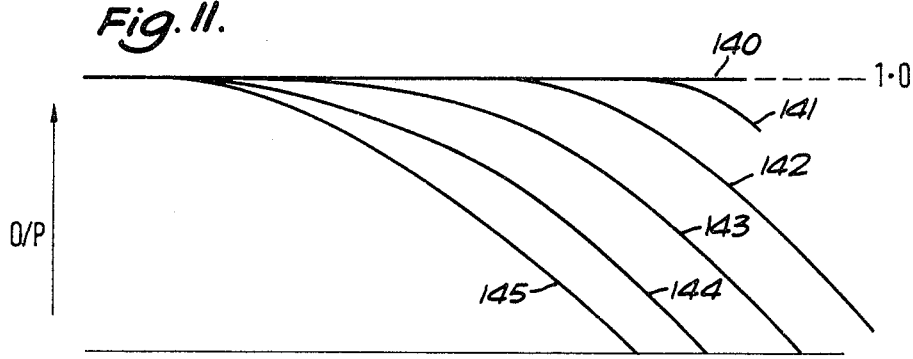

FIG. 9 illustrates an arrangement in which the controlled resistance is integrated into the filter circuit. In FIG. 9 the input signal is applied between terminals 130, 131 to give an output at output terminals 132, 133. Across the output terminals is a shunt capacitor 134. A series resistor 135 is connected between the input terminals 130 and one pole of the capacitor 134. A controlled resistance 136 is provided in shunt across this resistor 135. With this arrangement, as the magnitude of the controlled resistance 136 is decreased, the series resistor 135 is bypassed so changing the shape of the filter characteristic. This is illustrated in FIG. 11 which is a graphical diagram similar to FIG. 10 but showing the relationship between the output and frequency for the circuit of FIG. 9. For zero controlled resistance, there is no series resistance in the circuit and the response characteristic is indicated by the straight line 140. As the magnitude of the controlled resistance is increased, attenuation is introduced into the circuit, the attenuation being higher at higher frequencies. Curves 141 to 145 illustrate the characteristics for successively higher values of controlled resistance.

In a system having sum and difference signals, it may be preferred in some cases to utilise the difference signal for control purposes. This difference signal is, to a large extent, representative of the amount of stereo effect in that, if it is zero, there is no stereo effect whereas, if it is large, there is a large difference between the signals at the two outputs, i.e. a good stereo image.

Figure 12:
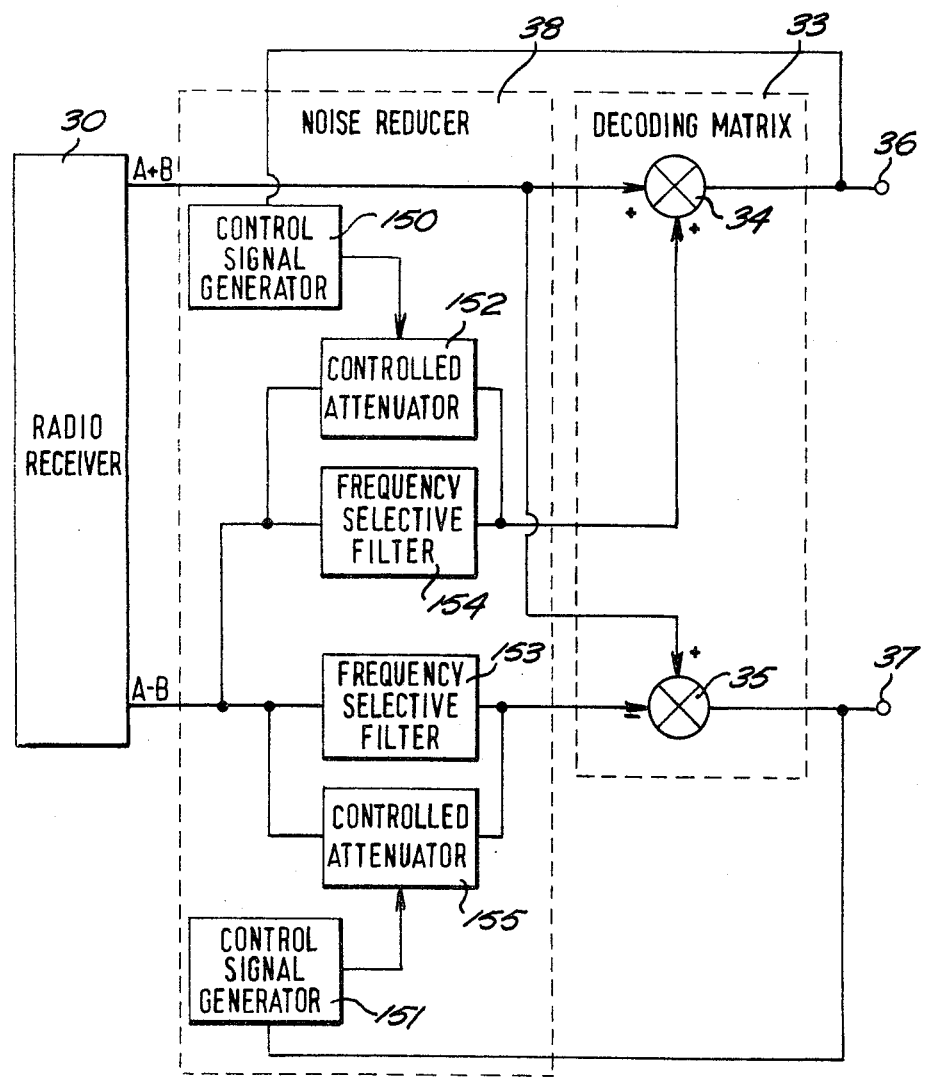
FIG. 12 is a block diagram of another construction of an FM stereo receiver.

In the arrangements described above, the cross talk between two or more channels has been controlled in accordance with one control signal. The amount of cross talk added at each output terminal may be separately controlled in accordance with the signal level at that output terminal. For example, the apparatus of FIG. 3 might be modified as shown in FIG. 12 to have two separate control signal generators 150, 151 fed respectively with signals from terminals 36 and 37 and providing control signals to attenuators 152, 155 respectively in shunt across frequency selective filters 154, 153. The units 150, 152, 154 control the addition in adding unit 34 while units 151, 153, 155 control the subtraction in difference unit 35.

I claim:

1. Stereo audio apparatus having input means providing at least two audio frequency input signals and at least two audio frequency signal output terminals to which are fed audio output signals derived from the input signals wherein there are provided controllable means including at least one frequency selective filter and adjustable signal level controller operably responsive to an applied control signal arranged for introducing cross talk at the higher end of the audio frequency band between output signals to the output terminals, control means including a high pass filter and rectifier arranged to receive at least one of the input and/or output signals to provide a control signal dependent on the amplitude of the high frequency component of said one of the input and/or output signals and means applying said control signal to said adjustable signal level controller to increase the cross talk as the signal level decreases.

2. Apparatus as claimed in claim 1 wherein said control means is responsive to the level of one audio input signal.

3. Apparatus as claimed in claim 1 wherein said control means is responsive to the level of at least two combined audio input signals.

4. Apparatus as claimed in claim 1 wherein said means for introducing cross talk is arranged to modify the frequency response characteristic of at least one filter controlling the part of the frequency band at which the cross talk is effective.

5. Apparatus as claimed in claim 1 wherein the adjustable signal level controller in said means for introducing cross talk comprises controllable shunt means across the output channels.

6. Apparatus as claimed in claim 1 wherein said adjustable signal level controller comprises means for altering the level of the input signal to or the output signal from said at least one frequency selective filter.

7. Apparatus as claimed in claim 1 wherein said adjustable signal level controller comprises means for modifying the responsive characteristic of said at least one frequency selective filter.

8. Apparatus as claimed in claim 1 and having four channels of output signals wherein the means for introducing cross talk is arranged to introduce the cross talk between all four channels in accordance with a single control signal.

9. Apparatus as claimed in claim 1 and having four channels of output signals wherein the means for introducing cross talk is arranged to introduce cross talk between pairs of channels in accordance with the amplitudes of the signals in the respective pairs.

10. Apparatus as claimed in claim 1 wherein said adjustable signal level controller for introducing cross talk includes a controllable attenuator.

11. Apparatus as claimed in claim 10 wherein the attenuator is a transistor to which is applied an optical signal derived from at least one of the input signals.

12. Apparatus as claimed in claim 10 wherein the attenuator is a transistor to which is applied a d.c. signal derived from at least one of the input signals.

13. Stereo audio apparatus having input means having at least two input channels carrying audio frequency input signals with one of the input channels having signals with a noise level substantially less than that on other channels, and having at least two audio frequency signal output terminals to which are fed audio output signals derived from the input signals wherein there are provided controllable means including a frequency selective filter and signal level controller controlling the output from the frequency selective filter in accordance with an applied control signal for introducing cross-talk at the higher frequency end of the audio frequency band between output signals to the output terminals, control means including a high pass filter and rectifier arranged to receive the signal on that one of said input channels having the lower noise level to produce a control signal and means for applying said control signal to said signal level controller to be operative on said controllable means to increase the cross-talk as the signal level decreases.

14. Radio receiving apparatus for receiving frequency modulated signals carrying stereo programmes using difference signals on a pilot carrier wherein there are provided means for demodulating the received signals to provide audio frequency input signals and decoding means for providing separate audio frequency signal outputs wherein there are provided controllable means including a frequency selective filter and adjustable signal level controller operably responsive to an applied control signal for introducing cross talk at the higher frequency end of the audio frequency band between the audio frequency output signals and means including a high pass filter and rectifier arranged to receive at least one of the audio frequency signals to provide a control signal dependent on the amplitude of said at least one of the audio frequency signals, and means applying said control signal to said adjustable signal level controller to increase the cross talk at the higher frequency end of the audio frequency band as the signal level decreases.

15. Apparatus as claimed in claim 14 wherein the adjustable signal level controller in said means for introducing cross talk between output signals comprises means for reducing the level of a difference signal fed to the decoding means.

16. Apparatus as claimed in claim 14 wherein said means responsive to the audio signal level is responsive to the sum signal from the demodulating means.

* * * * *